(12) United States Patent
Bruel

(10) Patent No.: US 8,492,877 B2
(45) Date of Patent: Jul. 23, 2013

(54) SEMICONDUCTOR STRUCTURE WITH SMOOTHED SURFACE AND PROCESS FOR OBTAINING SUCH A STRUCTURE

(75) Inventor: Michel Bruel, Veurey Voroize (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/349,263

(22) Filed: Jan. 12, 2012

(65) Prior Publication Data

US 2012/0199953 A1 Aug. 9, 2012

(30) Foreign Application Priority Data

Feb. 4, 2011 (FR) ...................................... 11 50935

(51) Int. Cl.
*H01L 29/30* (2006.01)
(52) U.S. Cl.
USPC .......................................................... 257/618
(58) Field of Classification Search
USPC ............ 257/618, E21.328, E29.106; 438/795
See application file for complete search history.

(56) References Cited

U.S. PATENT DOCUMENTS

| 6,846,718 | B1 | 1/2005 | Aga et al. ...................... 438/406 |
| 2007/0281172 | A1 | 12/2007 | Couillard et al. ............. 428/446 |
| 2008/0038894 | A1 | 2/2008 | Rueger et al. |
| 2009/0111248 | A1 | 4/2009 | Ohnuma et al. |

FOREIGN PATENT DOCUMENTS

| EP | 1 158 581 A1 | 11/2001 |
| EP | 2048705 A2 | 4/2009 |
| KR | 10-2009-0037364 A | 4/2009 |
| WO | WO 2007/142911 A2 | 12/2007 |

OTHER PUBLICATIONS

Search Report, French application No. 1150935 dated Aug. 31, 2011.

*Primary Examiner* — Roy Potter
(74) *Attorney, Agent, or Firm* — Winston & Strawn LLP

(57) ABSTRACT

The present invention relates to a process for smoothing the surface of a semiconductor wafer by fusion. The process includes defining a reference length which dimensions wafer surface roughness that is to be reduced or removed, and scanning the surface with a fusion beam while adjusting parameters of the fusion beam so as to fuse, during the scanning of the surface, a local surface zone of the wafer whose length is greater than or equal to the reference length, with the scanning continued to smooth the entire surface of the wafer by eliminating surface roughnesses of period lower than the reference length. The present invention also relates to a semiconductor wafer having a surface layer made of a semiconducting material that is smoothed by the process and that does not exhibit any roughness of period lower than the reference length.

19 Claims, 14 Drawing Sheets

US 8,492,877 B2

SEMICONDUCTOR STRUCTURE WITH SMOOTHED SURFACE AND PROCESS FOR OBTAINING SUCH A STRUCTURE

FIELD OF THE INVENTION

The present invention relates to a semiconductor wafer that is produced on the basis of at least one layer of semiconducting material whose surface has been smoothed by a particular smoothing process.

The invention also relates to a process for smoothing the surface of a semiconductor wafer.

The semiconductor wafers to which the invention relates may, in a nonlimiting manner, be of the Silicon On Insulator (SOI) type. It is specified that in this text the term SOI covers any type of wafer or, more generally, a substrate comprising a useful layer in which it will be possible to construct for example electronic components, a support layer and an electrically insulating layer between the useful layer and the support layer.

BACKGROUND OF THE INVENTION

Semiconductor wafers are used in applications such as electronics or optronics for example, especially to construct components and circuits on such structures. These wafers may be circular, with a diameter of for example 200, 300 or 450 mm, but they may also be substrates of other dimensions and shapes, such as for example rectangular panels for applications in the field of photovoltaics or displays (i.e., screens).

The surface quality of these wafers is an important parameter. This surface quality is characterized especially by a measure of roughness, which must be as low as possible. The roughness may be measured at various frequencies, high-frequency roughness characterizing variations of high spatial frequency of the surface state of the wafer whereas low-frequency roughness characterizes variations of lower spatial frequencies.

Several types of technique have been envisaged for improving this surface quality: planarization by mechanical or chemical means (or combinations thereof), thermal annealing (especially at high temperatures), etc. It has also been proposed that the surface of the wafers be exposed to pulsations of a radiation arising from a laser or from a microwave source. In this regard reference may be made for example to the document WO 2007/142911. This document proposes that a pulsed stream be applied to the surface of a substrate.

While WO 2007/142911 does disclose utility in reducing surface roughness, there still remains a need for improvements in such processing. The present invention now provides a practical improvement of the known techniques for decreasing the roughness of semiconductor wafers.

SUMMARY OF THE INVENTION

In accordance with the invention, a process for smoothing the surface of a semiconductor wafer by fusion is now provided, which process comprises defining a reference length which dimensions wafer surface roughness that is to be reduced or removed, and scanning the surface with a fusion beam while adjusting parameters of the fusion beam so as to fuse, during the scanning of the surface, a local surface zone of the wafer whose length is greater than or equal to the reference length, with the scanning continued to smooth the entire surface of the wafer by eliminating surface roughnesses of period lower than the reference length.

The invention also relates to a semiconductor wafer comprising a surface layer made of a semiconducting material in which the surface of the layer has been subjected to a process according to one of the aspects disclosed herein, such that the surface does not exhibit any roughness of period lower than the reference length.

BRIEF DESCRIPTION OF THE DRAWINGS

Other characteristics and advantages of the invention will emerge from the detailed description which follows, with reference to the appended drawings in which.

DETAILED DESCRIPTION OF THE INVENTION

Figure 1:
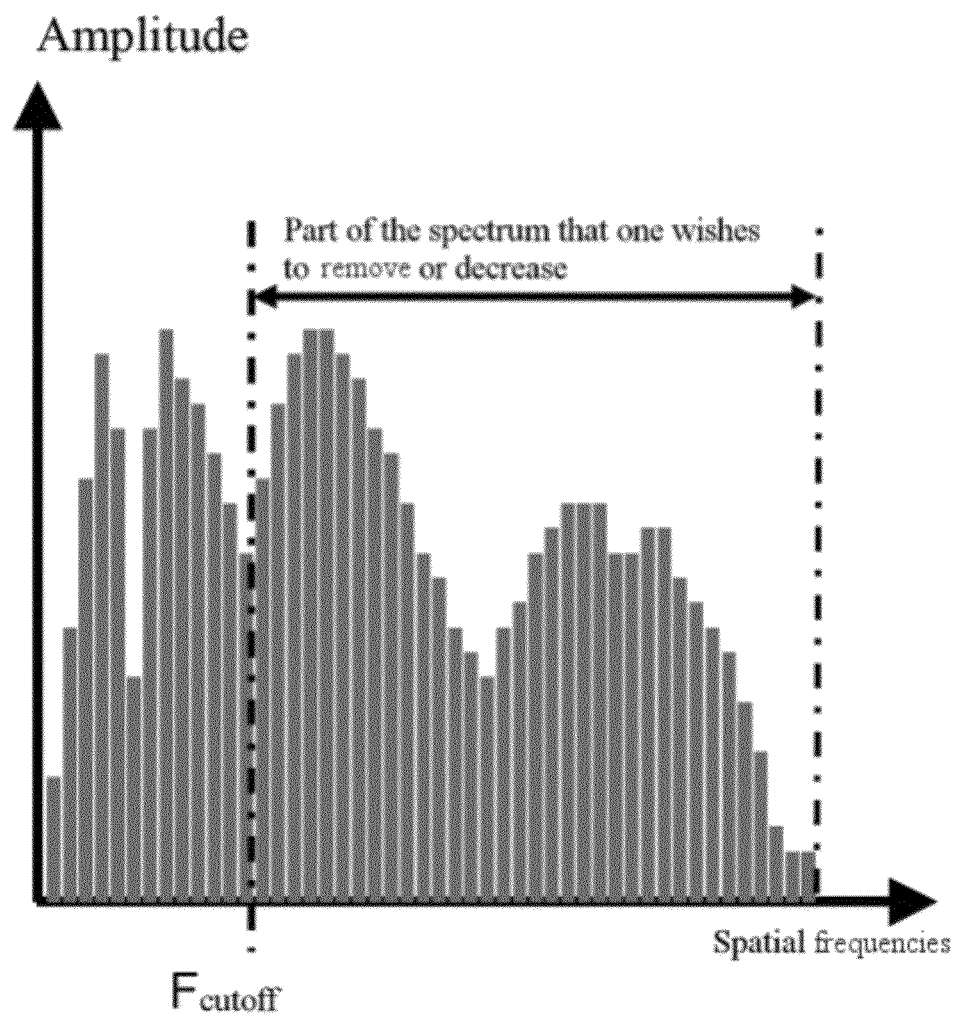
FIG. 1 is a schematic representation of a distribution of roughness spectrum that may be observed on a wafer, before its treatment according to the invention. This figure reveals a spatial cutoff frequency, beyond which it is desired to greatly reduce or indeed eliminate roughness.

As noted, the present process smoothes the surface of a semiconductor wafer by fusing of the surface. The fusing is conducted by scanning the surface with a fusion beam, with the following additional considerations:

The definition of a reference length,

The adjustment of the parameters of the fusion beam so as to fuse, during the scanning of the surface, a local surface zone of the wafer whose length is greater than or equal to the reference length, and The fusion is carried out to smooth the surface so as to eliminate the surface roughnesses of period lower than the reference length.

According to other advantageous and nonlimiting characteristics of the process:

The reference length is generally determined by analyzing the amplitude compared to the spatial frequencies of the surface of the semiconductor material and determining the part of the spectrum that needs to be reduced or removed in order to obtain the desired smoothness of the surface;

The reference length is advantageously determined subsequent to an observation of the roughness distribution of the surface of the wafer and by the identification of a cutoff frequency arising from the distribution of the roughness frequencies observed on the surface of the wafer;

The definition of the reference length is done subsequent to the determination of a reference dimension representative of devices requiring to be constructed in a surface region of the wafer, with the reference length being greater than or equal to the reference dimension;

The fusing comprises the fusion of the local zone of the wafer and the fusion beam is an energetic beam able to melt a surface region of the wafer;

The fusing generally comprises the feeding of molten material onto the local zone of the wafer with the fusion beam defined by the cross section of the feed stream of molten material on the surface of the wafer;

The parameters of the fusion beam to be adjusted include the speed of movement of the beam, the power density of the beam; or the flowrate of the feed stream of molten material, as applicable to the specific fusion conditions or type of fusion being conducted.

The features of these processes are better understood by the following description of the preferred embodiments that are shown in the drawings.

FIG. 1 is a schematic representation of a distribution of roughness spectrum that may be observed on a semiconductor wafer, before its treatment according to the invention. The wafer may have been obtained by layer transfer (for example by a process of the Smart-Cut type) or by some other layer transfer means. The surface of the wafer may for example be made of silicon.

On this graph, the amplitude corresponds to an intensity of roughness as a function of the spatial frequencies.

The graph of FIG. 1 reveals a spatial cutoff frequency, Fcutoff, beyond which it is desired to greatly reduce or indeed eliminate roughness. Stated otherwise, this cutoff frequency corresponds in terms of spatial periods to a length below which it is desired to greatly reduce or indeed eliminate roughness on the surface of the wafer.

Accordingly, the process proceeds by defining a reference length which will dimension the smoothing treatment that is to be applied to the surface of the wafer. This reference length may be equal to the period corresponding to Fcutoff (that is to say equal to $2\pi/\text{Fcutoff}$). Alternatively, the reference length may be related to the period corresponding to Fcutoff by any determined relation, for example a given proportionality relation. For the latter case, the reference length is equal to the period corresponding to Fcutoff, multiplied by a determined factor. It is also possible to define the reference length independently of the roughness observed on the surface of the wafer.

Once the reference length has been defined or determined, a smoothing treatment which comprises the fusing of the surface of the wafer by scanning the surface with a fusion beam will be applied to the surface. The term "fusing" is understood to mean any step leading to the provision of a molten state of material on the surface of the wafer, along with allowing the material to spread in a homogeneous and substantially planar manner. Fusing can thus be achieved by the implementation of two main configurations, which optionally may be combined:

(1) the application of a beam (continuous or non-continuous) of energy so as to melt the material of the surface of the wafer, and/or (2) the feeding of a stream of continuous or non-continuous molten material to the surface of the wafer.

By convention the following terms are defined herein:

the "fusion feed vector" as the energetic beam that makes it possible to melt the material of the surface of the wafer, and/or the feed stream of molten material, according to the applicable configuration, the "fusion beam" as the portion of space delimiting the fusion feed vector, the "molten zone" as the zone of the surface of the wafer which is in a molten state subsequent to the application of the fusion feed vector to this surface.

In the case of energy feed alone, the fusion feed vector is an energetic beam, for example a light beam arising from a source such as a laser, or any other energy source that has or provides sufficient energy to be able to melt the surface of the wafer. This includes beams of energetic particles and especially electrons or ions.

In the case of a feed of molten material alone, the fusion feed vector is a feed stream supplying molten material (for example silicon) on the surface of the wafer. The fusion beam is then defined by the cross section of the feed stream supplying molten material on the surface of the wafer.

In all cases, the fusion beam defines on the surface of the wafer an application length. This application length is at each instant the length of the zone of the surface of the wafer which is in a molten state on account of the application of the fusion beam. This zone is called the "molten zone".

In the case of a fusion beam moving in a continuous manner on the surface of the wafer, this molten zone also moves continuously. In the case of a beam applied in a stationary manner at a succession of sites on the surface of the wafer and moved incrementally the molten zone moves in a fragmented manner, incrementally.

In the case of a continuous movement of the fusion beam the molten zone extends to the surface of the wafer facing the fusion beam and also at the rear of the region of application of the beam to the surface of the wafer, this rear being defined with respect to the advance of the beam with respect to the wafer.

Figure 2A:
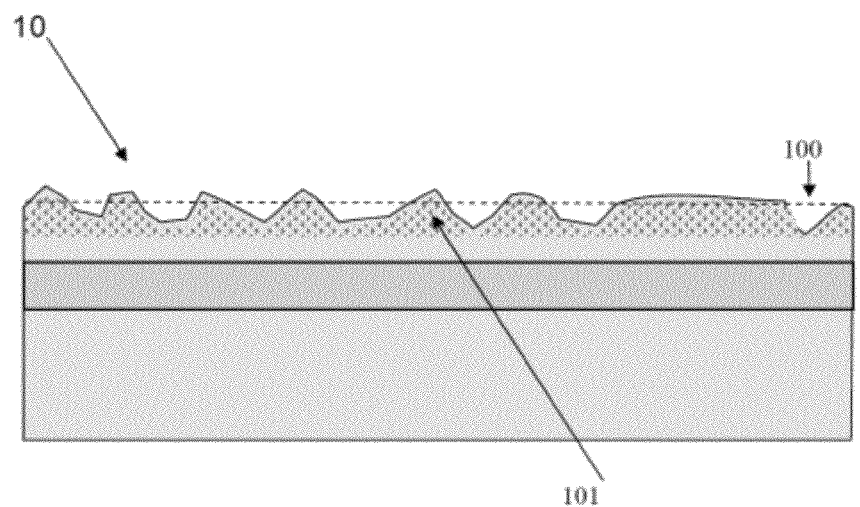
FIGS. 2a and 2B are schematic representations illustrating the smoothing principle implemented in the invention, revealing especially a localized zone melted by irradiation (FIG. 2b), the zone being of controlled length, with also showing in elevation a wafer before its smoothing (FIG. 2a), and during its smoothing (FIG. 2b)
Figure 2B:
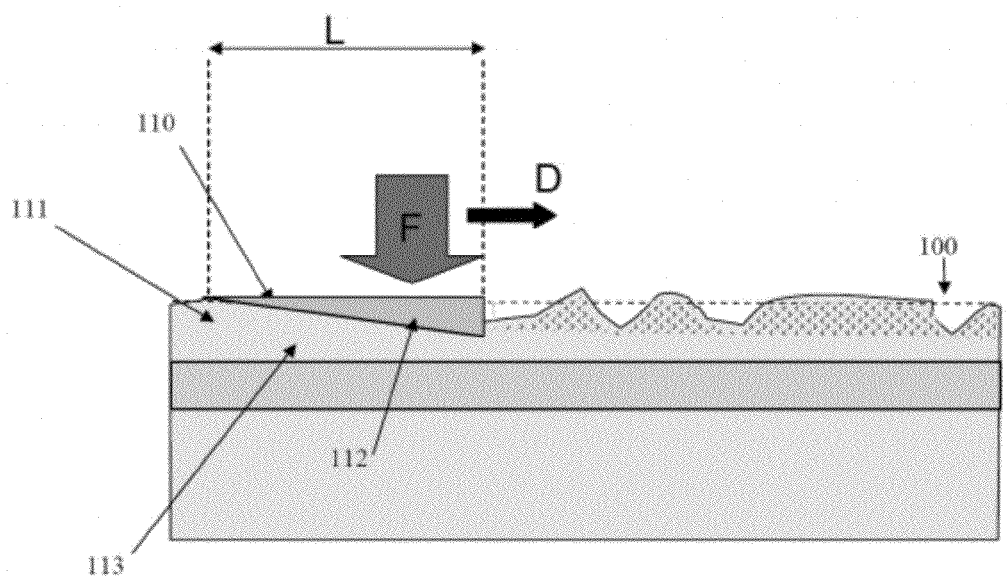
Figure 3:
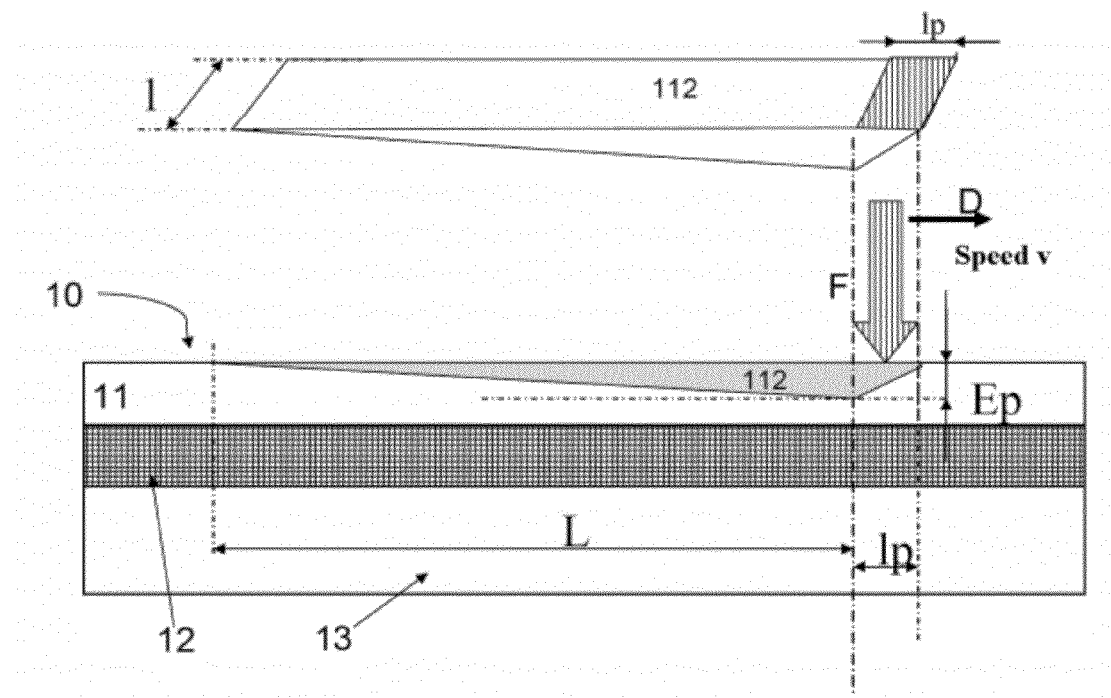
FIG. 3 is a representation of this localized zone, illustrating various parameters influencing the definition of this zone.

The molten zone thus extends, in the direction of advance of the beam (direction D in FIG. 2b), over a length L (see FIGS. 2b and 3). If the speed of movement of the fusion beam is constant (and the other parameters of the fusion beam do not change either) the length L is also constant.

As illustrated in FIG. 2b, it is important to control the parameters of the fusion beam so as to preserve a part of the thickness of the treated layer "non-molten" so as to allow the restoration, after cooling, of the crystalline quality of the treated layer.

The thickness of the surface layer which is melted is chosen in such a way that the non-molten remaining thickness is sufficient so that during the cooling-recrystallization phase this so-called remaining thickness can correctly play the role of seed in order for the recrystallization of the molten layer to proceed by epitaxy on this so-called seed. For example a non-molten remaining thickness representing from 25% to 50% of the thickness of a layer 200 nm in thickness could be suitable. This is obtained by the control of the characteristics of the fusion feed and of the fusion beam.

A non-molten region—which, during the subsequent cooling, will give the crystalline template for an epitaxial recrystallization if so desired—is thus preserved in the surface layer and under the molten region.

As can be appreciated, the scanning is preferably continued to smooth the entire surface of the wafer although there may be situations where only a portion or part of the surface is to be smoothed.

FIG. 2a shows a plane 100 which corresponds to the mid-plane of the disturbed surface of the wafer 10. The surface 101 of disturbed material extends on either side of this mid-plane.

FIG. 2b shows the smoothed surface 110 under the fusion beam and at the rear thereof. This smoothed surface is contained in the plane 100. The figure also shows the restored material 111, subsequent to the application of the fusion beam. The zone 112 melted locally by the fusion beam is seen, as is the region 113 of non-molten material.

As has been stated, the invention implements the definition of a reference length which is needed to determine the extent of the smoothing that is to be applied as well as to define the extent of surface roughness that is to be reduced or removed.

The invention also implements the adjustment of the parameters of the fusion beam so as to fuse, during the scanning of the surface of the wafer, a local surface zone of the wafer whose length is greater than or equal to the reference length. Stated otherwise, in the case of the invention the parameters of the beam are controlled in such a way that the length L is greater than or equal to the reference length.

This makes it possible to fuse—and therefore to even out—the material of the surface of the wafer over a length at least equal to the reference length that has been defined previously. In this way a particularly successful evening out of the surface of the wafer is achieved. In particular, the fusing of the surface causes the semiconductor material on the surface to melt and flow before hardening, thus converting the peaks and valleys of surface roughness into a re-solidified, smoother surface having a more uniform topography. Indeed the fusion thus carried out makes it possible to smooth out the surface so as to eliminate practically all the surface roughnesses of higher frequency (of lower period) than that corresponding to the reference length.

As mentioned herein, the control of the parameters of the beam also makes it possible to ensure that the surface layer is melted over part of its thickness only. Of course, it is important to not melt the entire thickness of the wafer as that will cause other problems. As it is only the surface roughness that needs to be addressed, the melting of only a few nm of thickness of the surface is generally sufficient.

The reference length may as has already been intimated have been defined on the basis of prior roughness measurements of the wafer. In this case the definition of the reference length follows subsequent to an observation of the roughness distribution of the surface of the wafer and to the identification of a cutoff frequency arising from the distribution of the roughness frequencies observed on the surface of the wafer.

The reference length may also have been defined in an analogous manner, on the basis of roughness measurements of one or more wafer(s) of one and the same batch having undergone treatment conditions identical to the wafer that it is desired to treat. It may also have been defined on the basis of a roughness spectrum recorded in advance and corresponding to the wafer.

The reference length may also have been defined by taking other considerations into account, for example the size of components that it will be desired to produce subsequently on the wafer (the reference length may then be chosen as the greatest length of the components).

In all cases, in a preferred embodiment the reference length is held constant during the application of the fusion beam.

It is possible to envisage controlling various parameters so as to adjust the fusion beam It is thus possible to adjust the speed of movement of the fusion beam. Indeed this speed contributes to determining the length L of the molten zone.

In the case of a fusion feed by an energetic beam, it is also possible to control the energy density of the beam. Indeed this parameter contributes to determining the characteristics of the fusion zone and especially its length L.

In the case of a fusion feed through a feed of a stream of molten material, it is also possible to control the flowrate of the material feed stream. Indeed this parameter contributes in this case to determining the characteristics of the fusion zone and especially its length L.

The semiconductor wafer thus treated comprises a surface layer made of a semiconducting material whose surface does not exhibit any significant roughness of lower period than the reference length.

FIG. 3 illustrates the localized zone of the wafer which is in fusion subsequent to the application of the fusion beam F. This figure illustrates various parameters influencing the definition of this zone.

This figure illustrates the application of the fusion beam to the surface of a wafer 10 comprising a surface layer 11, made for example of silicon, a support substrate 13, which may also be made of silicon, and a buried oxide layer 12. In this case the wafer 10 is of the SOI type.

FIG. 3 reveals the width 1 of the fusion beam, which is finite. Successive traversals of the beam are therefore undertaken, over parallel lines which cross the surface of the wafer completely. These successive traversals make it possible to cover the whole of the surface of the wafer with the beam and thus to treat this entire surface.

It is also possible to make provision for a beam whose width 1 is greater than the dimension of the wafer, so as to treat the whole of the wafer with a single traversal or pass of the beam.

It is also possible to make provision, as a variant, to carry out two successive coverages of the whole of the wafer, each of the two coverages involving one or more traversals of the beam according to a first and a second direction, respectively. The first and second directions may be orthogonal. The use of multiple coverages or scannings of the surface can further refine the surface smoothness when necessary.

In FIG. 3, the boundary between liquid and solid, situated at the front of the molten zone, is represented as a triangle whose vertex corresponds to the rear of the fusion beam. This is a schematic approximation since in reality the sides of the triangle are not strictly straight but exhibit an inwardly curved shape depending on the chosen conditions. Moreover it is possible that the vertex of the triangle may be shifted towards the rear, if for example the liquid phase of the surface has been heated particularly significantly during the traversal of the beam.

In FIG. 3, the thickness of the layer 12 of buried oxide is for example 1.5 microns, which value is consistent with the numerical examples which will be developed further on in this text with reference to FIGS. 5 to 7. It is noted that the recrystallization time of the material after fusion depending to first order on the capacity for the heat to escape to the mass of the substrate, the thickness of the buried oxide layer (which is a thermal insulant) plays an important role.

Figure 4A:
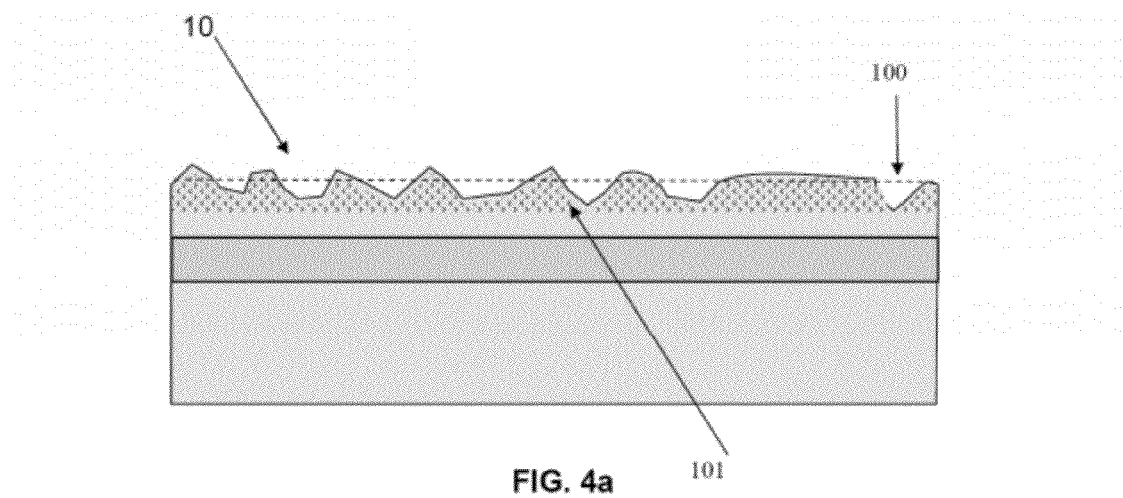
FIGS. 4a and 4b show two views analogous to those of FIGS. 2a and 2b to illustrate an embodiment of the invention in which the surface of the wafer to be smoothed is fed with molten material.
Figure 4B:
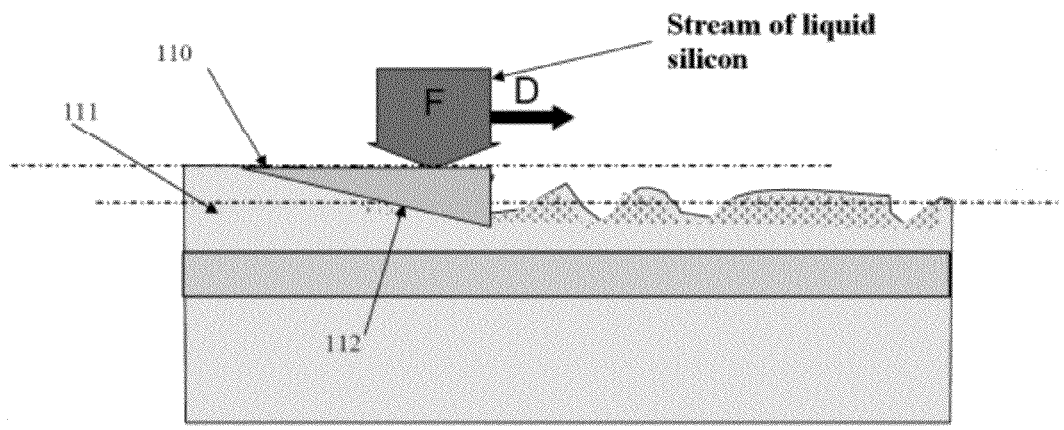

FIG. 4 shows two views analogous to those of FIGS. 2a and 2b (FIGS. 4a and 4b, respectively), in illustration of an embodiment of the invention in which molten material is fed to the surface of the wafer to be smoothed.

The molten material is generally of the same nature as (or indeed identical to) the material of the surface of the wafer (silicon in the case, represented in FIG. 4, of an SOI whose surface layer is made of silicon).

It is noted that in this case not only is the surface of the wafer smoothed but, on account of the feeding of molten material, its level is also slightly raised.

In all the variants of the invention the wafer obtained has after treatment a surface roughness whose components of higher frequency than a desired cutoff frequency have been eliminated, this constituting a noteworthy result.

With reference to FIGS. 5 to 7, certain considerations will now be set forth relating to two modes of implementation of the invention: by continuous scanning of the surface of the wafer by the fusion beam, and by incremental fragmented scanning.

These considerations are given in regard to a roughness modelled by a function s(x) which is the surface roughness (altitude variation of the surface) as a function of the abscissa x on the surface of a wafer. The function s(x) is considered to be integrable, since the roughness is limited in amplitude and the dimension of the die is finite. For the sake of simplification the function s(x) is also assumed to be even; hence the Fourier transform S(f) of s(x) is a real function (imaginary part=0).

The considerations which follow are based on mathematical modellings which provide an approximate picture of reality. Certain second-order approximations have been made so as to carry out and utilize these calculations which thus represent a simplified model making it possible to highlight different results for the continuous treatment and the fragmented treatment.

It has thus been considered in the Fourier analyses that the molten phase is perfectly plane. In practice this will not always be entirely the case at any moment because of the surface tension of the molten material and of the transient and dynamic aspects in the liquid phase (waves, potential micro-ripples, etc.).

Figure 5A:
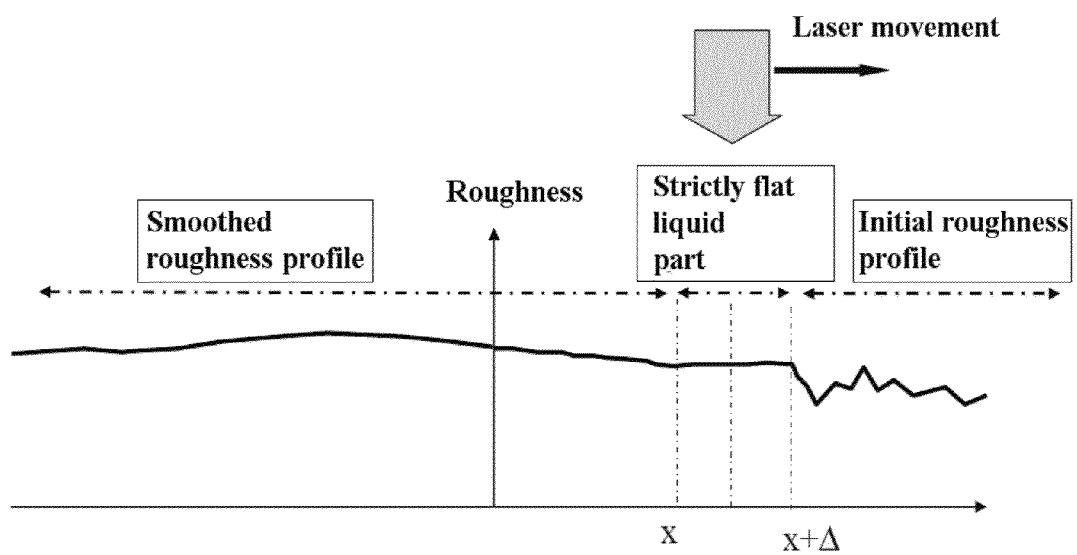
FIGS. 5a and 5b illustrate the evolution of a surface treated for a time interval dt, in the case of a continuous treatment (e.g., implementing a scanning of the surface to be treated by a fusion beam moving in a continuous manner)
Figure 5B:
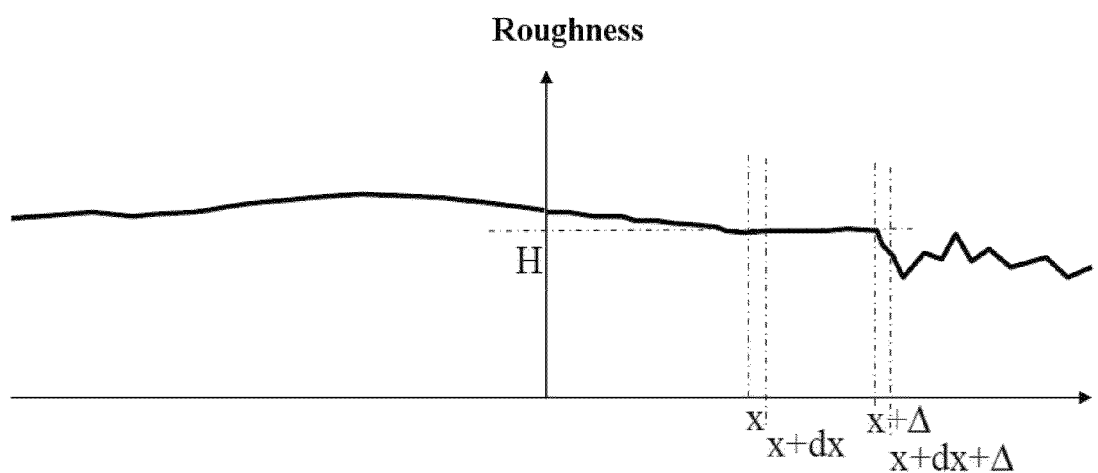

FIGS. 5a and 5b illustrate the evolution of a surface treated for a time interval dt, in the case of a continuous treatment (that is to say implementing a scanning of the surface to be treated by a fusion beam moving in a continuous manner).

s(x) is the initial roughness profile, $\bar{s}(x)$ is the smoothed roughness profile.

When x increases by dx, H varies by dH, so:

$dH = d\bar{s}(x)$ $dH = (s(x+\Delta)dx - \bar{s}(x)dx)/\Delta$

Hence: $d\bar{s}(x)/dx = (s(x+\Delta) - \bar{s}(x))/\Delta$

The Fourier analysis of this signal gives the following results.

$i\omega \cdot \bar{S}(\omega) = (\exp(i\omega\Delta) \cdot S(\omega) - \bar{S}(\omega))/\Delta$ $\bar{S}(\omega) \cdot (i\omega + 1/\Delta) = (\exp(i\omega\Delta) \cdot S(\omega))/\Delta$ $\bar{S}(\omega) = S(\omega) \cdot (\exp(i\omega\Delta))/(i\omega\Delta + 1)$ Calling $F(\omega) = \exp(i\omega\Delta)/(i\omega\Delta + 1)$ $\bar{S}(\omega) = S(\omega) \cdot F(\omega)$ $\bar{D}(\omega)$, the energy spectral density of $\bar{S}(\omega)$, is given by:

$\bar{D}(\omega) = \bar{S}(\omega) \cdot \bar{S}^*(\omega) = S(\omega) \cdot F(\omega) \cdot S^*(\omega) \cdot F^*(\omega)$ $\bar{D}(\omega) = S(\omega) \cdot S^*(\omega) \cdot F(\omega) \cdot F^*(\omega) = D(\omega) \cdot F(\omega) \cdot F^*(\omega)$ Where $D(\omega)$ is the energy spectral density of the unsmoothed signal.

$F(\omega) \cdot F^*(\omega) = (\exp(i\omega\Delta)/(i\omega\Delta + 1)) \cdot (\exp(-i\omega\Delta)/(-i\omega\Delta + 1))$ $F(\omega) \cdot F^*(\omega) = 1/(1 + \Delta^2\omega^2)$ Hence: $\bar{D}(\omega) = D(\omega) 1/(1 + \Delta^2\omega^2)$ i.e.: $\bar{D}(f) = D(f)/(1 + 4\Pi^2\Delta^2 f^2) = D(f) \cdot \alpha(2\Pi\Delta f)$ FIG. 5c thus represents a function termed alpha, $\alpha(2\Pi\Delta f) = 1/(1 + 4\Pi^2\Delta^2 f^2)$, which is the transfer function making it possible to pass from the spectral density of the roughness before the treatment to the spectral density of the roughness after a continuous treatment such as this. It is observed that the values of this function decrease rapidly. In this figure a cutoff value is represented by a vertical dotted axis.

Figure 5C:
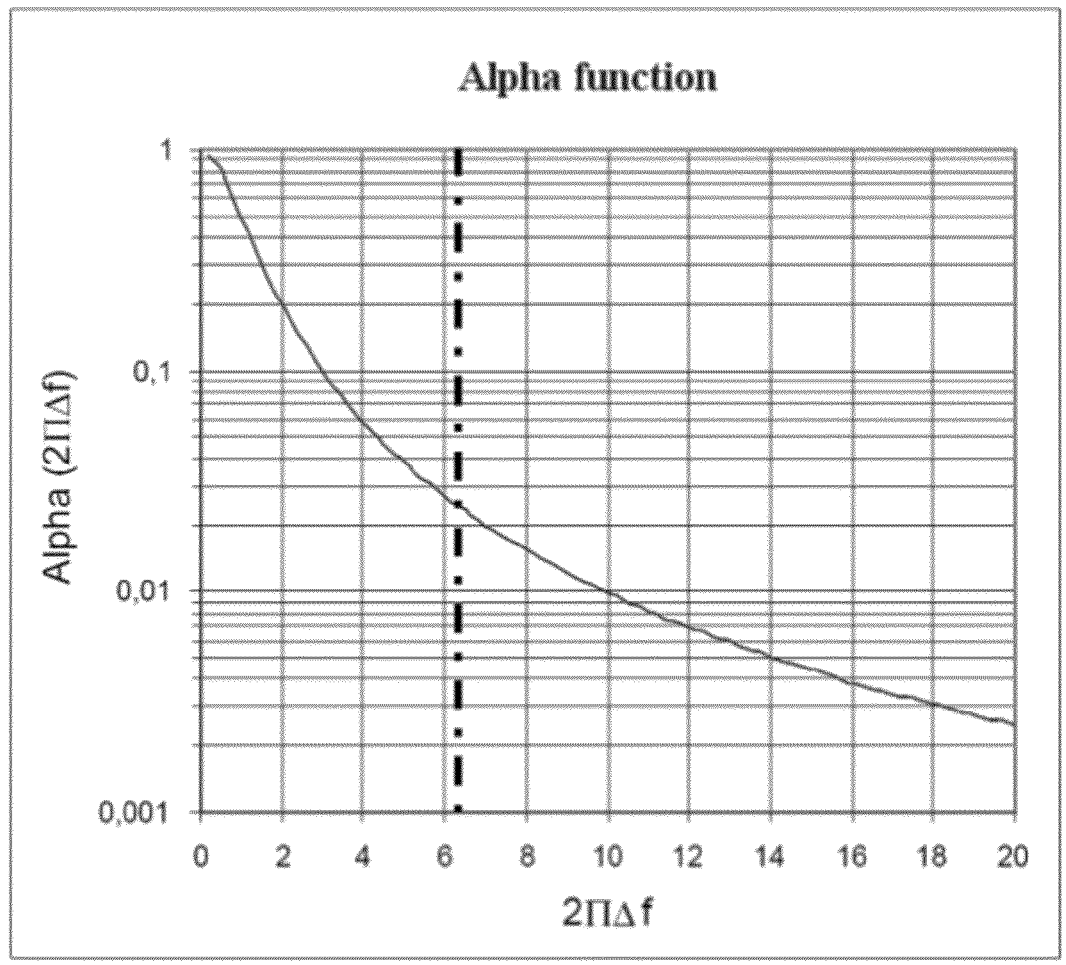
FIG. 5c represents a function termed alpha by a continuous treatment such as in FIGS. 5a and 5b.
Figure 5D:
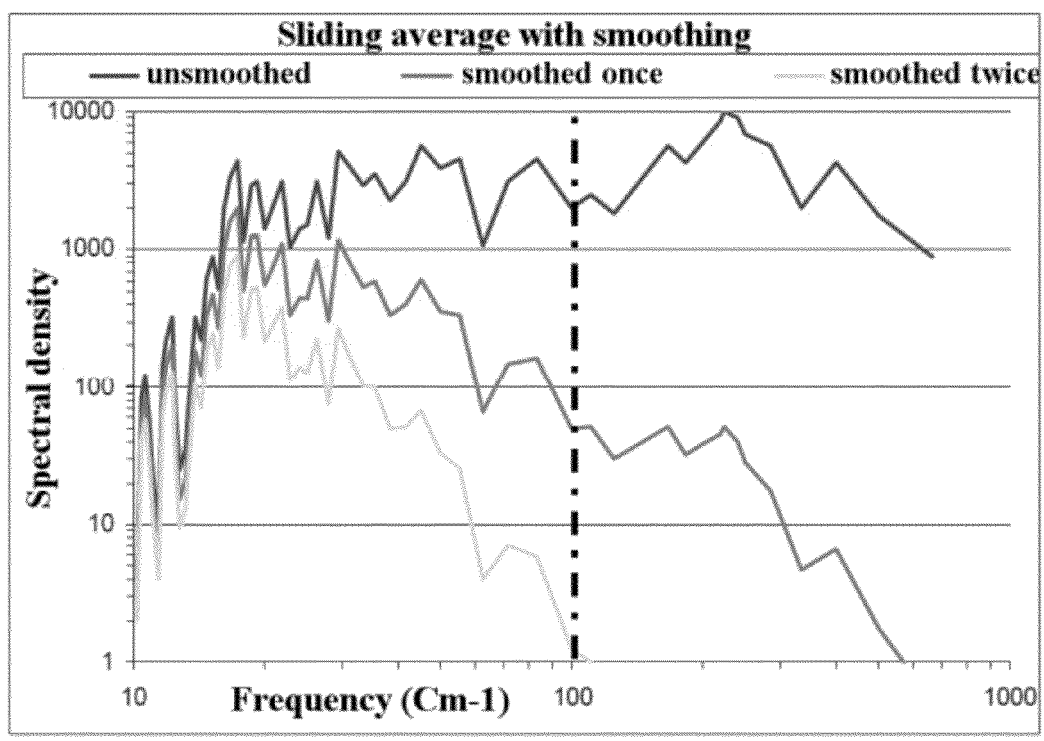
FIG. 5d represents the spectral densities of roughness frequencies observed on the surface of a wafer, without treatment and with one and then two continuous treatments, starting from an arbitrary initial roughness spectrum.

FIG. 5d represents the spectral densities of roughness frequencies observed on the surface of a wafer, without treatment and with one and then two continuous treatments, starting from an arbitrary initial roughness spectrum.

A noticeable decrease in the roughness after a treatment, and a still more pronounced decrease after a second treatment, are observed in this figure. After this second treatment practically no more roughnesses of frequency greater than 100 cm$^{-1}$ are observed.

Figure 5E:
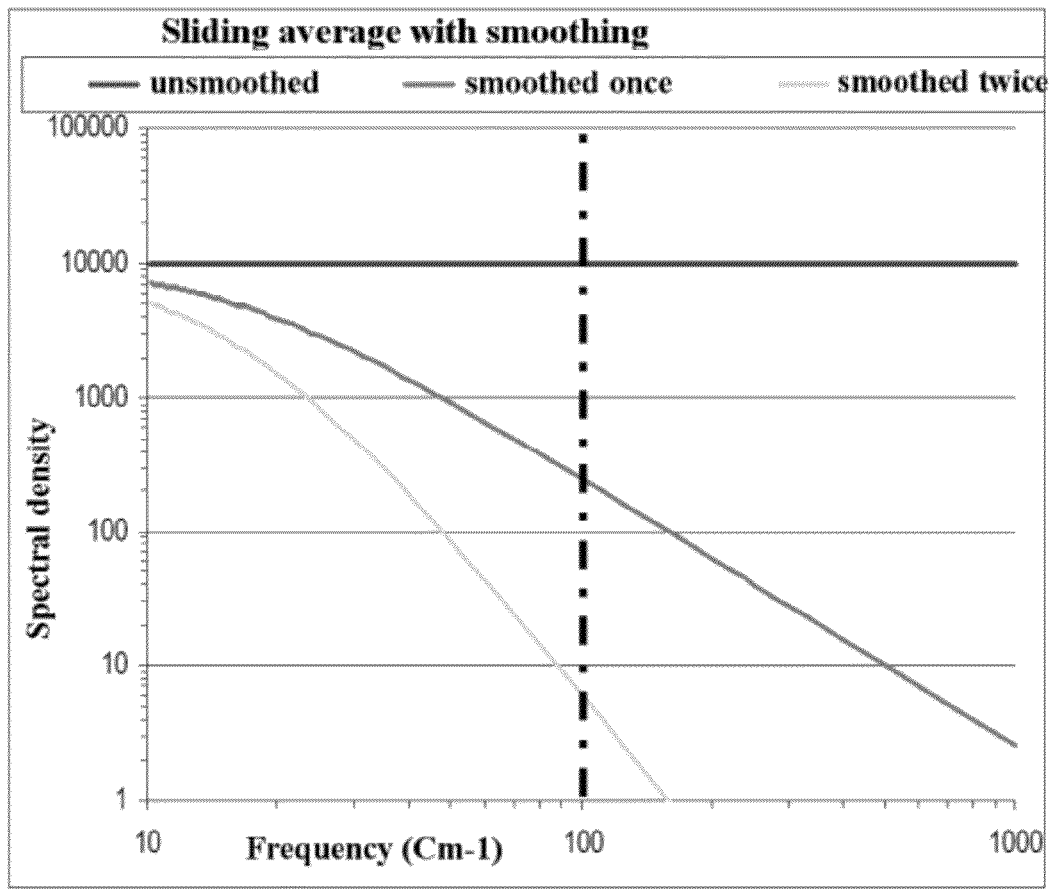
FIG. 5e represents the spectral densities of roughness frequencies observed on the surface of a wafer, without treatment and with one and then two continuous treatments, starting from a white initial roughness spectrum.

FIG. 5e represents the spectral densities of roughness frequencies observed on the surface of a wafer, without treatment and with one and then two continuous treatments, this time starting from a white initial roughness spectrum.

Here again noticeable decreases are observed. It is noted that the decrease in roughness is slightly less significant than in the case of FIG. 5d.

Generally FIGS. 5c to 5e show that the effect of the sliding averaging smoothing over the roughness spectrum:
  Is independent of the direction of scanning (left right or right left),
  Although very significant, it does not make it possible to totally eliminate the frequencies higher than the cutoff frequency,
  A second traversal leaves practically no roughness in this frequency range,
  It also significantly attenuates the frequencies below the cutoff frequency, this also being a very beneficial result.

Figure 6A:
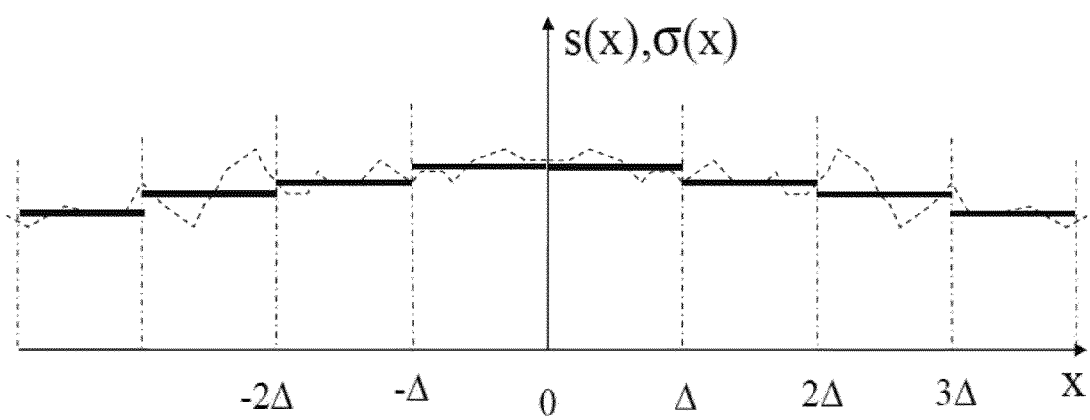
FIG. 6a illustrates the evolution of a surface treated for a time interval dt, in the case of a fragmented treatment (e.g., implementing a scanning of the surface to be treated by a fusion beam moving incrementally)

FIG. 6a illustrates the evolution of a surface treated for a time interval dt, in the case of a fragmented treatment (implementing a scanning of the surface to be treated by a fusion beam moving incrementally).

The Fourier analysis of the function s(x) is carried out on the following bases:
  Let S(f) be the frequency spectrum of the surface roughness s(x),
  Let D be the length of each spot (each site on the surface of the wafer at which the beam will be stopped), The curve s(x) is transformed by the spot by spot treatment into a curve δ(x) consisting of a series of flat parts of length Δ, of height si, lying between the abscissae (i−1)Δ and iΔ, To the even real curve δ(x) there corresponds a frequency spectrum Σ(f) which will be calculated.

The values of si are calculated as follows:

$$si = (1/\Delta) \times \int_{(i-1)\Delta}^{i\Delta} s(x)dx$$

$$si = (1/\Delta) \times \int_{(i-1)\Delta}^{i\Delta} dx \int_{-\infty}^{+\infty} S(\omega) \cdot \exp(i\omega x)d\omega$$

The order of integration is changed:

$$si = \left(\frac{1}{\Delta}\right) \times \int_{-\infty}^{+\infty} d\omega \int_{(i-1)\Delta}^{i\Delta} S(\omega) \cdot \exp(i\omega x)dx$$

Since S(ω) is real, $$si = \left(\frac{1}{\Delta}\right) \times \int_{-\infty}^{+\infty} d\omega \int_{(i-1)\Delta}^{i\Delta} S(\omega) \cdot \cos(\omega x)dx =$$

$$\left(\frac{1}{\Delta}\right) \times \int_{-\infty}^{+\infty} S(\omega)d\omega \int_{(i-1)\Delta}^{i\Delta} \cos(\omega x)dx$$

Hence $si = \left(\frac{1}{\Delta}\right) \times \int_{-\infty}^{+\infty} S(\omega) \cdot (\sin(i\omega\Delta) - \sin((i-1)\omega\Delta))d\omega/\omega$ $$si = (2/\Delta) \times \int_{-\infty}^{+\infty} S(\omega) \cdot ((i+1/2)\omega\Delta) \cdot \sin(\omega\Delta/2))d\omega/\omega$$

The Fourier transform, Σ(w), of δ(x) is calculated using the following general steps (given by way of example for the calculation of the transform of a function ei(x)).

$e_i(x) = e_{i+}(x) + e_{i-}(x)$ $e_{i+}(x) = Ech(x - \Delta(t-1)) - Ech(x - t\Delta)$ $e_{i-}(x) = -Ech(x + \Delta(i-1)) + Ech(x - t\Delta)$ Hence Laplace Transform:

$E_{i+}(p) = (1/p)\exp(-\Delta(i-1)p) - (1/p)\exp(-t\Delta p)$ $E_{i-}(p) = -(1/p)\exp(+\Delta(i-1)p) + (1/p)\exp(+t\Delta p)$ $E_i(p) = (1/p)\exp(-\Delta(i-1)p) - \exp(+\Delta(i-1)p)\exp(i\Delta p) - \exp(-i\Delta p))$ Hence Fourier Transform:

$E_i(j\omega) = (1/j\omega)(\exp(-\Delta(i-1)j\omega) - \exp(+\Delta(t-1)j\omega) + \exp(i\Delta j\omega) - \exp(-i\Delta j\omega))$ $E_i(j\omega) = (2/j\omega)(-j\sin(\Delta)i-1)\omega) + j\sin(i\Delta\omega))$ $E_i(j\omega) = (-2/\omega)(\sin(\Delta(i-1)\omega) - \sin(i\Delta\omega))$ $E_i(j\omega) = (4/\omega)(\cos(\Delta(i-1/2)\omega) \cdot \sin(\Delta\omega/2))$ This results in:

$$\sigma(x) = \sum_{1}^{\infty} si \cdot e_i(x)$$

$$\sum(\omega) = \sum_{1}^{\infty} si \cdot E_i(\omega)$$

$$\sum(\omega) =$$

$$\sum_{1}^{\infty}\left[(2/\Delta) \times \int_{-\infty}^{+\infty} S(\omega) \cdot \cos((i+1/2)\omega\Delta) \cdot \sin(\omega\Delta/2))d\omega/\omega\right] \cdot$$

$$[(4/\omega)(\sin(\Delta(i-1/2)\omega) \cdot \cos(\Delta\omega/2))]$$

Figure 6B:
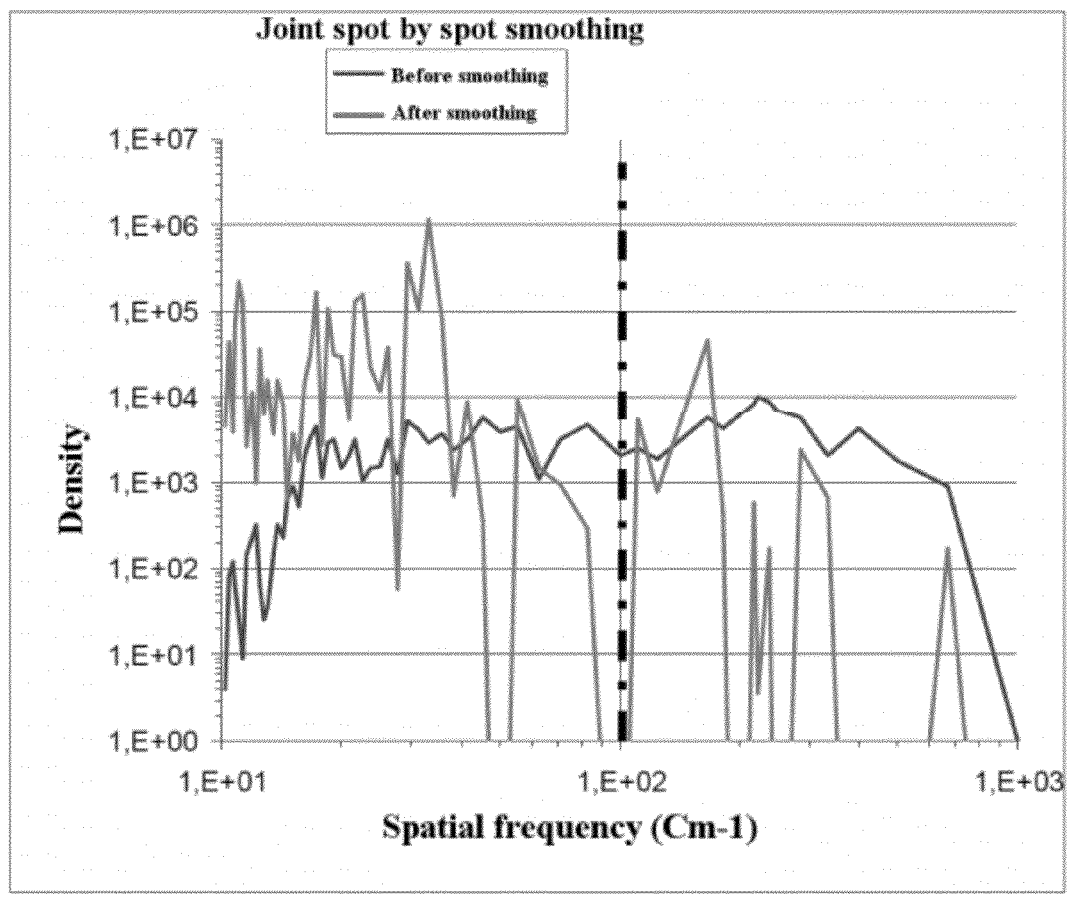
FIG. 6b represents the spectral densities of roughness frequencies observed on the surface of a wafer, without treatment and with a fragmented treatment, starting from an arbitrary initial roughness spectrum.

FIG. 6b represents the spectral densities of roughness frequencies observed on the surface of a wafer, without treatment and with a fragmented treatment, starting from an arbitrary initial roughness spectrum.

Figure 6C:
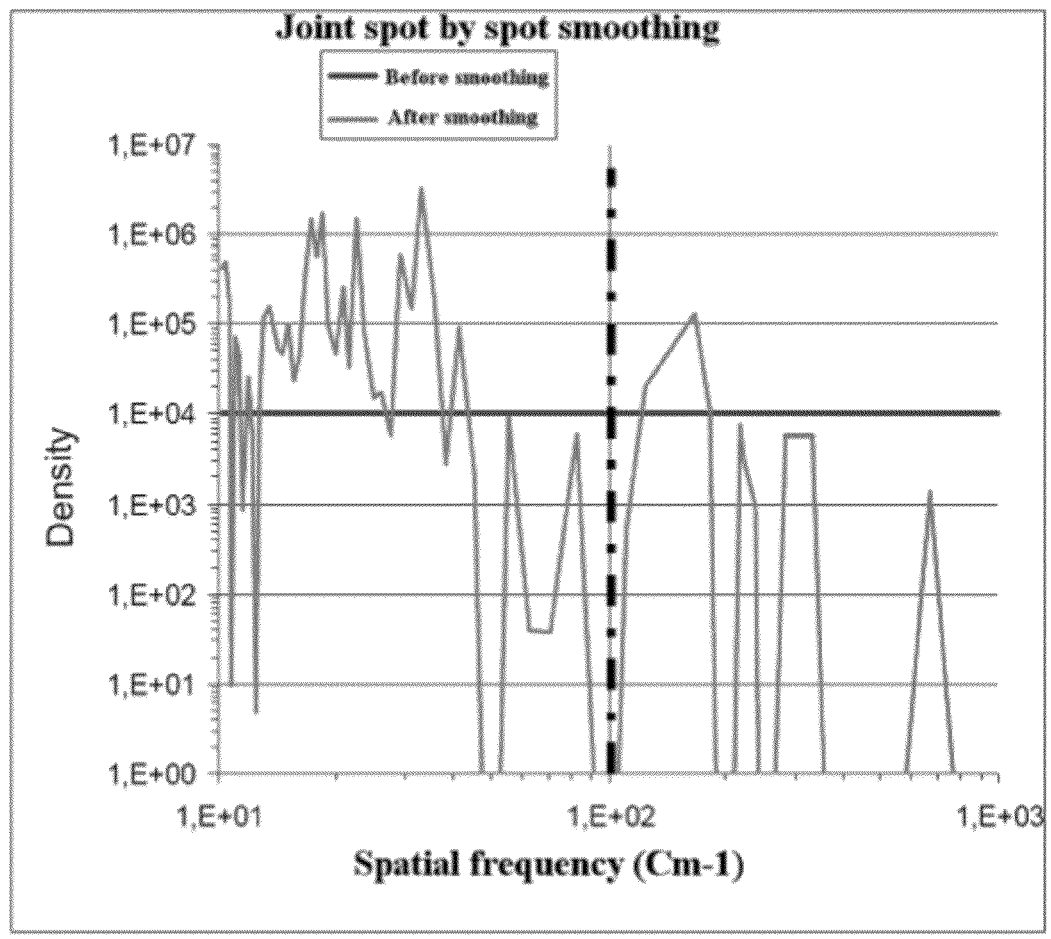
FIG. 6c represents the spectral densities of roughness frequencies observed on the surface of a wafer, without treatment and with a fragmented treatment, starting from a white initial roughness spectrum.

FIG. 6c represents the spectral densities of roughness frequencies observed on the surface of a wafer, without treatment and with a fragmented treatment, starting from a white initial roughness spectrum.

It is seen that the effect of the spot by spot smoothing on the roughness spectral density is substantially less effective than in the case of a continuous treatment:

As regards the frequencies above the cutoff frequency, it very greatly attenuates the existing frequencies place by place, but it reveals numerous high-intensity peaks As regards the frequencies below the cutoff frequency, It does not make it possible to totally eliminate the existing frequencies furthermore it generates others, of large amplitude.

Figure 7A:
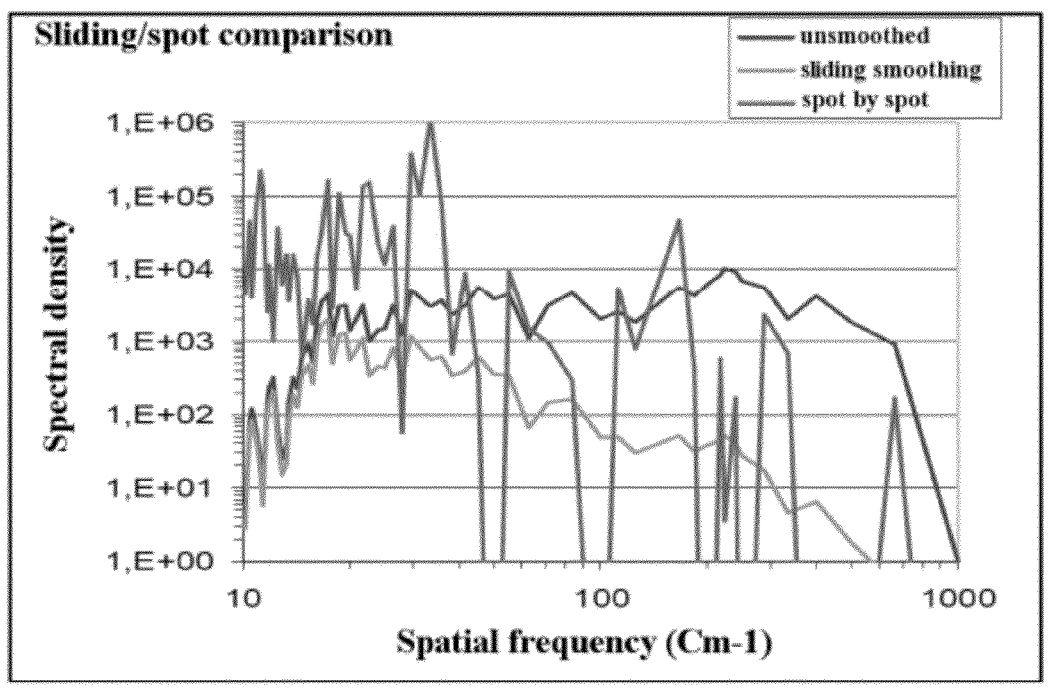
FIG. 7a represents the spectral densities of roughness frequencies observed on the surface of a wafer, without treatment, with a continuous treatment and with a fragmented treatment, starting from an arbitrary initial roughness spectrum.

FIG. 7a represents the spectral densities of roughness frequencies observed on the surface of a wafer, without treatment, with a continuous treatment and with a fragmented treatment, starting from an arbitrary initial roughness spectrum.

Figure 7B:
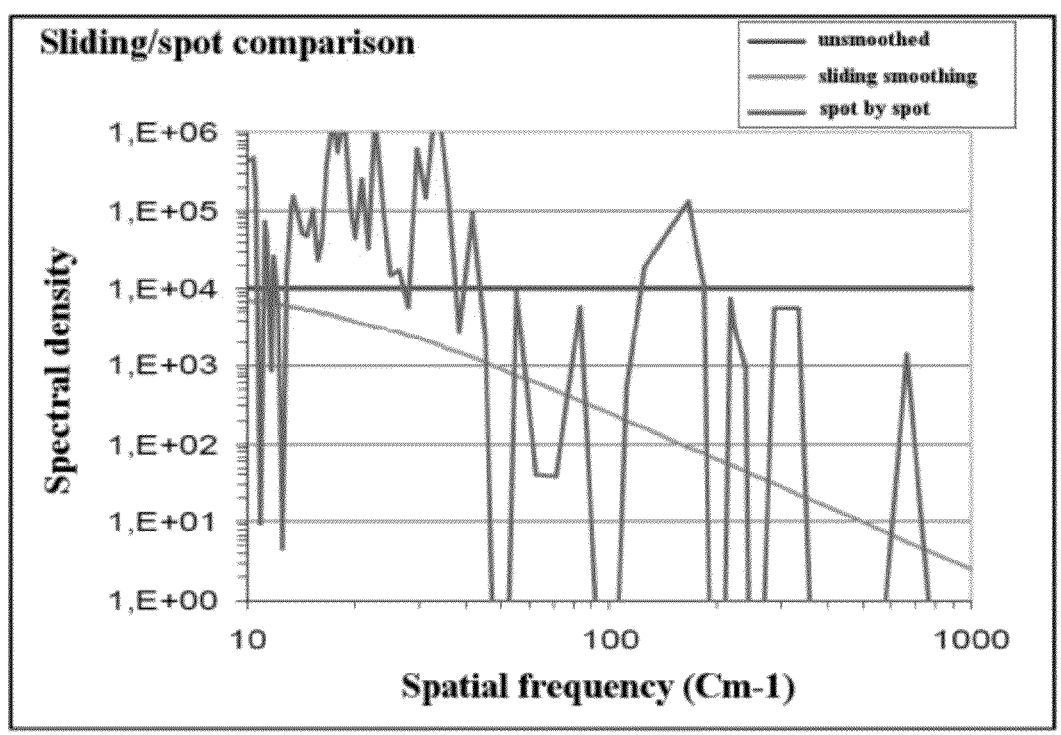
FIG. 7b represents the spectral densities of roughness frequencies observed on the surface of a wafer, without treatment, with a continuous treatment and with a fragmented treatment, starting from a white initial roughness spectrum.

FIG. 7b represents the spectral densities of roughness frequencies observed on the surface of a wafer, without treatment, with a continuous treatment and with a fragmented treatment, starting from a white initial roughness spectrum.

These two figures confirm the superior performance of the continuous treatment.

EXAMPLE

A numerical example is given hereinafter by way of illustration only and not to limit the invention in any way.

Let $Q(J \cdot m^{-3})$ be the volumetric energy density required to achieve fusion.

Let τ(s) be the time required for the recrystallization boundary to reach the surface.

Let ΔT(s) be the residence time of the beam at a point.

Let $F(W \cdot m^{-2})$ be the surface power density of the beam.

Let Ep(m) be the maximum melted depth.

Let lp(m) be the dimension of the beam in the direction of scanning.

Let $v(m \cdot s^{-1})$ be the speed of movement of the beam.

Let L(m) be the unrecrystallized length after the traversal of the beam.

Relational Orders of Magnitude:

$Ep = F^*\Delta T/Q = F^*lp/(Q^*v)$ $L = \tau^*v$

Numerical Example:

$F = 7\ MW \cdot cm^{-2}$ $Q = 7000\ J \cdot cm^{-3}$ $\Delta T = 1 \cdot 10^{-7}\ s$ $lp = 0.01\ cm = 100\ \mu m$ $v = 1000\ m \cdot s^{-1}$ $\tau = 1 \cdot 10^{-6}\ s = 1\ \mu s$

--------------------

$L = 10^3 \times 10^{-6} = 1 \cdot 10^{-3}\ m = 1000\ \mu m$ $Ep = 7 \cdot 10^6 \times 10^{-7} / 7000 = 1 \cdot 10^{-4}\ cm = 1\ \mu m$

What is claimed is:

1. A process for smoothing the surface of a semiconductor wafer by fusion, which comprises defining a reference length which dimensions wafer surface roughness that is to be reduced or removed, and scanning the surface with a fusion beam while adjusting parameters of the fusion beam so as to fuse, during the scanning of the surface, a local surface zone of the wafer whose length is greater than or equal to the reference length, with the scanning continued to smooth the entire surface of the wafer by eliminating surface roughnesses of period lower than the reference length, wherein the reference length is defined by observing roughness distribution on the surface of the wafer and identifying a cutoff frequency arising from the observed distribution of roughness frequencies.

2. A process for smoothing the surface of a semiconductor wafer by fusion, which comprises defining a reference length which dimensions wafer surface roughness that is to be reduced or removed, and scanning the surface with a fusion beam while adjusting parameters of the fusion beam so as to fuse, during the scanning of the surface, a local surface zone of the wafer whose length is greater than or equal to the reference length, with the scanning continued to smooth the entire surface of the wafer by eliminating surface roughness of period lower than the reference length, wherein the reference length is defined by determining a reference dimension representative of devices that are to be constructed in the surface of the wafer, with the reference length being greater than or equal to the reference dimension.

3. The process of claim 1, wherein the fusing comprises providing a molten local zone on the wafer with the fusion beam being an energetic beam of sufficient intensity melt a surface region of the wafer.

4. A process for smoothing the surface of a semiconductor wafer by fusion, which comprises defining a reference length which dimensions wafer surface roughness that is to be reduced or removed, and scanning the surface with a fusion beam while adjusting parameters of the fusion beam so as to fuse, during the scanning of the surface, a local surface zone of the wafer whose length is greater than or equal to the reference length, with the scanning continued to smooth the entire surface of the wafer by eliminating surface roughness of period lower than the reference length, wherein the fusing comprises the feeding of molten material onto a local zone of the wafer with the fusion beam being defined by a cross section of the feed stream of molten material on the surface of the wafer.

5. The process of claim 1, wherein the parameters of the fusion beam include the speed of movement of the beam.

6. The process of claim 1, wherein the parameters of the fusion beam include the power density of the beam.

7. The process of claim 4, wherein the parameters of the fusion beam include the flowrate of the feed stream of molten material.

8. The process of claim 1, which further comprises conducting multiple scannings of the surface to provide further or enhanced smoothness to the wafer surface.

9. The process of claim 8 wherein the scannings are conducted sequentially and orthogonally on the wafer surface.

10. The process of claim 1, which further comprises providing a buried oxide layer in the wafer wherein the buried oxide layer has a thickness sufficient to act as a thermal insulator for the wafer to facilitate heat removal from the wafer.

11. The process of claim 1, wherein the fusing comprises providing a molten local zone on the wafer with the fusion beam being an energetic beam sufficient intensity to melt a surface region of the wafer.

12. The process of claim 3 wherein the parameters of the fusion beam include the speed of movement of the beam or the power density of the beam.

13. The process of claim 3, which further comprises conducting multiple scannings of the surface to provide further or enhanced smoothness to the wafer surface.

14. The process of claim 13, wherein the scannings are conducted sequentially and orthogonally on the wafer surface.

15. The process of claim 3, which further comprises providing a buried oxide layer in the wafer wherein the buried oxide layer has a thickness sufficient to act as a thermal insulator for the wafer to facilitate heat removal from the wafer.

16. The process of claim 4, wherein the parameters of the fusion beam include the speed of movement of the beam or the power density of the beam.

17. The process of claim 4, which further comprises conducting multiple scannings of the surface to provide further or enhanced smoothness to the wafer surface.

18. The process of claim 17, wherein the scannings are conducted sequentially and orthogonally on the wafer surface.

19. The process of claim 4, which further comprises providing a buried oxide layer in the wafer wherein the buried oxide layer has a thickness sufficient to act as a thermal insulator for the wafer to facilitate heat removal from the wafer.

* * * * *

UNITED STATES PATENT AND TRADEMARK OFFICE
CERTIFICATE OF CORRECTION

PATENT NO. : 8,492,877 B2  
APPLICATION NO. : 13/349263  
DATED : July 23, 2013  
INVENTOR(S) : Bruel Page 1 of 1

It is certified that error appears in the above-identified patent and that said Letters Patent is hereby corrected as shown below:

In the Claims:

Column 11:  
Line 41 (claim 2, line 9), change "roughness" to -- roughnesses --.  
Line 49 (claim 3, line 3), after "intensity" insert -- to --.

Column 12:  
Line 2 (claim 4, line 9), change "roughness" to -- roughnesses --.  
Line 27 (claim 11, line 3), after "energetic beam" insert -- of --.

Signed and Sealed this  
Seventeenth Day of September, 2013

Teresa Stanek Rea  
*Deputy Director of the United States Patent and Trademark Office*